(12) United States Patent
Urashima et al.

(10) Patent No.: US 11,512,214 B2
(45) Date of Patent: Nov. 29, 2022

(54) COMPOSITION CONTAINING ORGANIC SOLVENTS WITH DIFFERENT VAPOR PRESSURES, CONDUCTOR MADE FROM COMPOSITION, METHOD FOR MANUFACTURING CONDUCTOR, AND STRUCTURE COMPRISING CONDUCTOR

(71) Applicant: HITACHI CHEMICAL COMPANY, LTD., Tokyo (JP)

(72) Inventors: Kohsuke Urashima, Tokyo (JP); Yoshinori Ejiri, Tokyo (JP); Takaaki Nohdoh, Tokyo (JP); Motoki Yonekura, Tokyo (JP); Ryuji Akebi, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 16/763,408

(22) PCT Filed: Nov. 13, 2018

(86) PCT No.: PCT/JP2018/042000
§ 371 (c)(1),
(2) Date: May 12, 2020

(87) PCT Pub. No.: WO2019/098196
PCT Pub. Date: May 23, 2019

(65) Prior Publication Data
US 2020/0399493 A1    Dec. 24, 2020

(30) Foreign Application Priority Data
Nov. 14, 2017 (JP) .............................. JP2017-219061

(51) Int. Cl.
| | |
|---|---|
| *C09D 11/52* | (2014.01) |
| *C09D 11/30* | (2014.01) |
| *H01B 1/02* | (2006.01) |
| *H01B 1/22* | (2006.01) |
| *H01B 5/14* | (2006.01) |
| *H01B 13/00* | (2006.01) |
| *C09D 11/033* | (2014.01) |
| *H05K 1/09* | (2006.01) |
| *H05K 3/10* | (2006.01) |
| *C09D 11/037* | (2014.01) |
| *C09D 11/36* | (2014.01) |

(52) U.S. Cl.
CPC ............ *C09D 11/52* (2013.01); *C09D 11/033* (2013.01); *C09D 11/037* (2013.01); *C09D 11/30* (2013.01); *H01B 1/02* (2013.01); *H01B 1/026* (2013.01); *H01B 1/22* (2013.01); *H01B 5/14* (2013.01); *H01B 13/00* (2013.01); *H01B 13/0026* (2013.01); *H05K 1/09* (2013.01); *H05K 3/10* (2013.01); *C09D 11/36* (2013.01)

(58) Field of Classification Search
None
See application file for complete search history.

(56) References Cited

U.S. PATENT DOCUMENTS

| | | | |
|---|---|---|---|
| 7,201,793 B2* | 4/2007 | Iijima | .................... C09D 11/32 106/31.58 |
| 2007/0009092 A1* | 1/2007 | Ikeda | .................... A61B 6/583 378/98.2 |
| 2007/0283848 A1 | 12/2007 | Kim et al. | |
| 2008/0241414 A1 | 10/2008 | Kim et al. | |
| 2009/0214833 A1* | 8/2009 | Oyanagi | .............. C09D 11/322 428/195.1 |
| 2010/0227081 A1* | 9/2010 | Cote | ................... H01L 51/0007 427/557 |
| 2011/0059230 A1 | 3/2011 | Hoerteis et al. | |
| 2013/0277096 A1* | 10/2013 | Seong | ...................... H05K 1/02 252/514 |
| 2014/0009545 A1 | 1/2014 | Carmody | |
| 2014/0035995 A1* | 2/2014 | Chou | ........................ B41J 2/01 347/20 |
| 2014/0127409 A1 | 5/2014 | Harada et al. | |
| 2014/0287158 A1* | 9/2014 | Heyen | ...................... H01B 1/22 252/512 |
| 2015/0228415 A1* | 8/2015 | Seok | .................... H01G 9/2027 136/256 |
| 2016/0155814 A1* | 6/2016 | Ogawa | ................... C09D 11/52 257/288 |

(Continued)

FOREIGN PATENT DOCUMENTS

| | | |
|---|---|---|
| CN | 103732701 A | 4/2014 |
| CN | 105393312 A | 3/2016 |
| EP | 2564954 A | 3/2013 |

(Continued)

OTHER PUBLICATIONS

Translation of International Written Opinion for PCT/JP2018/042000 (priority document to Instant app.); available online from WIPO website; pp. 1-8. (Year: 2019).*

(Continued)

*Primary Examiner* — Katie L. Hammer

(74) *Attorney, Agent, or Firm* — Fitch, Even, Tabin & Flannery, LLP

(57) ABSTRACT

Disclosed is a composition containing copper particles and organic solvents, in which the organic solvents include a first organic solvent having a vapor pressure at 20° C. of 200 Pa or more and 20 kPa or less, and a second organic solvent having a vapor pressure at 20° C. of 0.5 Pa or more and less than 200 Pa.

17 Claims, No Drawings

(56) References Cited

U.S. PATENT DOCUMENTS

2017/0226362 A1* 8/2017 Fratello .................. B33Y 70/00
2018/0015547 A1* 1/2018 Okada ...................... H01B 5/00

FOREIGN PATENT DOCUMENTS

| EP | 2883922 A | 6/2015 | |
|---|---|---|---|
| JP | 2009-286934 A | 12/2009 | |
| JP | 2012-072418 A | 4/2012 | |
| JP | 2014-507510 A | 3/2014 | |
| JP | 2014-148732 A | 8/2014 | |
| JP | 2016-037626 A | 3/2016 | |
| JP | 2016-037627 A | 3/2016 | |
| JP | 2017-514988 A | 6/2017 | |
| WO | 2014/112683 A1 | 7/2014 | |
| WO | WO-2016121749 A1 * | 8/2016 | ............... H01B 1/22 |
| WO | 2017/70843 A1 | 5/2017 | |

OTHER PUBLICATIONS

"Database WPI, Week 201156, 2011", Thomson Scientific, London, GB; AN 2011-E15544, Apr. 13, 2011, XP002802249 (cited in a Search Report dated Mar. 22, 2021 in counterpart EP Patent Application No. 18878393.0).

* cited by examiner

COMPOSITION CONTAINING ORGANIC SOLVENTS WITH DIFFERENT VAPOR PRESSURES, CONDUCTOR MADE FROM COMPOSITION, METHOD FOR MANUFACTURING CONDUCTOR, AND STRUCTURE COMPRISING CONDUCTOR

CROSS-REFERENCE TO RELATED APPLICATIONS

This application is a U.S. national phase application filed under 35 U.S.C. § 371 of International Application No. PCT/JP2018/042000, filed Nov. 13, 2018, designating the United States, which claims priority from Japanese Patent Application 2017-219061, filed Nov. 14, 2017, which are hereby incorporated herein by reference in their entirety.

TECHNICAL FIELD

The present invention relates to a composition, a conductor, a method for producing the same, and a structure.

BACKGROUND ART

As a method of forming a metal pattern, a so-called printed electronics method including a forming step of a layer including a metal on a base material by ink jet printing, screen printing, or the like with a conductive material such as an ink, a paste, and the like including particles of a metal such as copper and the like; and a conductorizing step of sintering the metal particles by heating the conductive material to express conductivity is known (see, for example, Patent Literature 1 and Patent Literature 2).

In recent years, attention has been focused on molded interconnect devices (hereinafter sometimes referred to as "MID") from the viewpoint of reducing size and weight of wirings. MID is a member in which a wiring is directly formed on a molded article. According to an MID forming technique, a structure in which a wiring is formed in a dead space of a device, a structure in which a harness is removed, and the like can be manufactured, and thus, it is possible to achieve a reduction in the weight of a vehicle-mounted member, a reduction in the size of a smartphone, and the like. In general, as the MID forming technique, a laser direct structuring method (hereinafter sometimes referred to as an "LDS method") is known. However, the LDS method has suffered from problems such as a use of a resin containing a special catalyst, a large environmental load of electroless plating, and the like, and accordingly, there is a limit to devices to which the LDS method can be applied. For this reason, an aerosol jet printing method which enables formation of a wiring by directly printing a conductive material, in particular, a conductive material containing copper particles, which is excellent in terms of cost, on a molded article has attracted attention.

CITATION LIST

Patent Literature

Patent Literature 1: JP No. 2012-072418
Patent Literature 2: JP No. 2014-148732

SUMMARY OF INVENTION

Technical Problem

However, in a case where a conventional conductive material is applied to aerosol jet printing, it may be difficult to atomize and print the conductive material in some cases. In addition, from the viewpoint of securing a current amount, a wiring of MID is required to have a sufficient thickness (for example, 1 μm or more) in a case where a thin wire (for example, a line width of 200 μm or less) is formed. For this reason, there is a demand for development of a conductive material capable of forming such a wiring.

The present invention has been made in view of such circumstances and has a main object to provide a composition capable of forming a wiring having a sufficient thickness even in a case where being applied to aerosol jet printing.

Solution to Problem

One aspect of the present invention is to provide a composition containing copper particles and organic solvents, in which the organic solvents include a first organic solvent having a vapor pressure at 20° C. of 200 Pa or more and 20 kPa or less, and a second organic solvent having a vapor pressure at 20° C. of 0.5 Pa or more and less than 200 Pa.

By using such a composition, it is possible to form a wiring having a sufficient thickness even in the case of being applied to aerosol jet printing.

A content of the copper particles may be 20 to 80 parts by mass with respect to 100 parts by mass of the total mass of the composition.

A viscosity at 25° C. of the composition may be 50 to 3000 mPa·s.

The composition may be for aerosol jet printing. In addition, the present invention may further relate to the application of the above-described composition as an aerosol jet printing ink or paste, or the application of the above-described composition for producing an aerosol jet printing ink or paste.

In another aspect, the present invention provides a method for producing a conductor, including a step of atomizing the above-described composition and a step of printing the atomized composition. The method for producing a conductor may further include a step of sintering the printed composition.

In still another aspect, the present invention provides a conductor including a sintered body obtained by sintering the above-described composition.

In yet another aspect, the present invention provides a structure including a base material and the above-described conductor provided on the base material.

Advantageous Effects of Invention

According to the present invention, a composition capable of forming a wiring having a sufficient thickness even in the case of being applied to aerosol jet printing is provided. In addition, according to the present invention, a conductor using such a composition, a method for producing the same, and a structure are also provided.

DESCRIPTION OF EMBODIMENTS

Hereinafter, embodiments for carrying out the present invention will be described in detail. However, the present invention is not limited to the following embodiments. In the following embodiments, the components (including the element steps and the like) are not essential unless otherwise specified. The same applies to numerical values and ranges therewith, and the present invention is not limited thereto.

In the present specification, the term "step" includes not only a step which is independent of the other steps but also a step which cannot be clearly distinguished from other steps as long as it enables accomplishment of a purpose of the step.

In the present specification, a numerical value range indicated by "to" includes the numerical values described before and after "to" as the minimum value and the maximum value, respectively.

With regard to numerical value ranges which are stepwisely described in the present specification, the upper limit value or lower limit value described in one numerical value range may be replaced with the upper limit value or the lower limit value in another numerical value range stepwisely described. Further, with regard to the numerical value ranges described in the present specification, the upper limit values or the lower limit values of the numerical value ranges may also be replaced with the values shown in Examples.

In the present specification, in a case where a plurality of substances corresponding to each component are present in a composition, a content ratio or content of each component in the composition means the total content ratio or content of the plurality of substances present in the composition unless otherwise specified.

[Composition]

The composition according to the present embodiment contains copper particles (A) and organic solvents (B).

<Copper Particles (A)>

The copper particles preferably have copper as a main component from the viewpoints of thermal conductivity and sinterability. The elemental ratio occupied by copper in the copper particles may be 80% by atom or more, 90% by atom or more, or 95% by atom or more, with respect to all the elements except for hydrogen, carbon, and oxygen. If the elemental ratio occupied by copper is 80% by atom or more, the thermal conductivity and the sinterability derived from copper tend to be easily expressed.

The shapes of the copper particles are not particularly limited, but examples thereof include a spheric shape, a substantially spheric shape, a polyhedronic shape, a needle shape, a flake shape, and a rod shape.

The copper particles may include two or more kinds of copper particles having different shapes. By incorporating two or more kinds of copper particles having different shapes, cracks in a wiring thus formed are suppressed and a wiring having a sufficient thickness tends to be easily formed. A reason thereof is not necessarily clear, but is considered to be that two or more different kinds of copper particles supplement gaps to each other and thus, omnidirectional generation of a decrease in the volume due to fusion between the copper particles, and the like is suppressed. This is presumed to result in suppression of cracks even in a wiring having a sufficient thickness. A combination of those having different shapes is not particularly limited but, for example, a combination of spherical copper particles (A1) and flake-shaped copper particles (A2) is preferable.

A median diameter of the spherical copper particles (A1) may be 0.1 to 2.0 μm, 0.1 to 1.2 μm, 0.3 to 0.9 μm, or 0.1 to 0.6 μm. A median diameter of the flake-shaped copper particles (A2) may be 0.03 to 9.0 μm, 0.03 to 7.0 μm, 0.03 to 4.0 μm, or 0.03 to 2.5 μm. With the combination of the spherical copper particles (A1) and the flake-shaped copper particles (A2), each of which have such median diameters, the fusion properties at a low temperature tend to be more excellent. In the present specification, the median diameter of the copper particles means a value of D50 (a cumulative median value of volume distribution) measured with a laser diffraction type particle size distribution analyzer (for example, a submicron particle analyzer N5 PLUS (Beckman Coulter, Inc.) and the like).

A ratio of the content of the spherical copper particles (A1) to the content of the flake-shaped copper particles (A2) (the content of the spherical copper particles (A1)/the content of the flake-shaped copper particles (A2)) in the composition may be 0.25 to 4.0, 0.3 to 3.0, or 0.4 to 2.5. If the ratio of the content of the spherical copper particles (A1) to the content of the flake-shaped copper particles (A2) is within such a range, cracks tend to be further suppressed.

The content of the copper particles may be 20 to 80 parts by mass with respect to 100 parts by mass of the total mass of the composition. The content of the copper particles may be 30 parts by mass or more, 40 parts by mass or more, or 50 parts by mass or more. If the content of the copper particles is 20 parts by mass or more with respect to 100 parts by mass of the total mass of the composition, a wiring having a more sufficient thickness tends to be formed. The content of the copper particles may be 75 parts by mass or less, 70 parts by mass or less, or 65 parts by mass or less. If the content of the copper particles is 80 parts by mass or less with respect to 100 parts by mass of the total mass of the composition, the dischargeability from a printing machine tends to be more excellent.

In one embodiment, the copper particles may be copper-containing particles having core particles including copper and an organic material covering at least a part of the surface of the core particles. The copper-containing particles may have, for example, core particles including copper and an organic material including a substance derived from an alkylamine present on at least a part of the surface of the core particles. The alkylamine may be an alkylamine whose hydrocarbon group has 7 or less carbon atoms. Since the hydrocarbon group of the alkylamine constituting the organic material has a relatively short chain length, the copper-containing particles are thermally decomposed even at a relatively low temperature (for example, 150° C. or lower) and the core particles tend to be easily fused with each other. As such copper-containing particles, for example, the copper-containing particles described in JP No. 2016-037627 can be suitably used.

The organic material may include an alkylamine whose hydrocarbon group has 7 or less carbon atoms. The alkylamine whose hydrocarbon group has 7 or less carbon atoms may be, for example, a primary amine, a secondary amine, an alkylenediamine, or the like. Examples of the primary amine include ethylamine, 2-ethoxyethylamine, propylamine, 3-ethoxypropylamine, butylamine, 4-methoxybutylamine, isobutylamine, pentylamine, isopentylamine, hexylamine, cyclohexylamine, and heptylamine Examples of the secondary amine include diethylamine, dipropylamine, dibutylamine, ethylpropylamine, and ethylpentylamine Examples of the alkylenediamine include ethylenediamine, N,N-dimethylethylenediamine, N,N'-dimethylethylenediamine, N,N-diethylethylenediamine, N,N'-diethylethylenediamine, 1,3-propanediamine, 2,2-dimethyl-1,3-propanediamine, N,N-dimethyl-1,3-diaminopropane, N,N'-dimethyl-1,3-diaminopropane, N,N-diethyl-1,3-diaminopropane, 1,4-diaminobutane, 1,5-diamino-2-methylpentane, 1,6-diaminohexane, N,N'-dimethyl-1,6-diaminohexane, and 1,7-diaminoheptane.

The organic material covering at least a part of the surface of the core particles may include an organic material other than the alkylamine whose hydrocarbon group has 7 or less carbon atoms. The ratio of the alkylamine whose hydrocarbon group has 7 or less carbon atoms with respect to the entire organic material is preferably 50% by mass or more, more preferably 60% by mass or more, and still more preferably 70% by mass or more.

The ratio of the organic material covering at least a part of the surface of the core particles is preferably 0.1 to 20% by mass with respect to the total of the core particles and the organic material. If the ratio of the organic material is 0.1% by mass or more, sufficient oxidation resistance tends to be obtained. If the ratio of the organic material is 20% by mass or less, conductorization at a low temperature tends to be easily achieved. The ratio of the organic material with respect to the total of the core particles and the organic material is more preferably 0.3 to 10% by mass, and still more preferably 0.5 to 5% by mass.

The copper-containing particles include at least copper, and may include other substances as necessary. Examples of other substances include metals such as gold, silver, platinum, tin, nickel, and the like, compounds including such metal elements, reducing compounds or organic materials, oxides, and chlorides. From the viewpoint of forming a conductor having excellent conductivity, the content ratio of copper in the copper-containing particles is preferably 50% by mass or more, more preferably 60% by mass or more, and still more preferably 70% by mass or more.

A method for producing the copper-containing particles is not particularly limited. Examples of the production method include the method for producing copper-containing particles disclosed in JP No. 2016-037626.

<Organic Solvents (B)>

The composition according to the present embodiment contains organic solvents. The organic solvents include a first organic solvent having a vapor pressure at 20° C. of 200 Pa or more and 20 kPa or less, and a second organic solvent having a vapor pressure at 20° C. of 0.5 Pa or more and less than 200 Pa. The organic solvents may be organic solvents composed of the first organic solvent and the second organic solvent (that is, organic solvents which do not include an organic solvent having a vapor pressure at 20° C. of less than 0.5 Pa and an organic solvent having a vapor pressure at 20° C. of more than 20 kPa). If a composition containing organic solvents having different vapor pressures is applied to aerosol jet printing, the composition is easily atomized, and thus, a wiring having a sufficient thickness can be formed. A reason thereof is not necessarily clear, but for a reason that the copper particles are dispersed in a sufficient amount of the organic solvents, fine liquid droplets tend to be easily generated. The first organic solvent (B1) having high volatility is expected to increase a solid content ratio in the liquid droplets since it is volatilized before reaching an aerosol jet nozzle while accelerating atomization, and as a result, it may be possible to form a wiring having a sufficient thickness. On the other hand, the second organic solvent (B2) having low volatility is expected to remain in liquid droplets without volatilization, and thus, it may be possible to keep the composition concentration constant and maintain printing performance.

(First Organic Solvent (B1))

The first organic solvent is not particularly limited as long as it has a vapor pressure at 20° C. of 200 Pa or more and 20 kPa or less, and a known organic solvent can be used. The vapor pressure at 20° C. of the first organic solvent may be 210 Pa or more, 220 Pa or more, 230 Pa or more, 240 Pa or more, or 250 Pa or more. The vapor pressure at 20° C. of the first organic solvent may be 15 kPa or less, 12 kPa or less, 10 kPa or less, 8 kPa or less, or 6 kPa or less.

Examples of the first organic solvent include cyclohexanone (vapor pressure at 20° C.: 260 Pa), ethanol (vapor pressure at 20° C.: 5.95 kPa), methyl ethyl ketone (vapor pressure at 20° C.: 9.5 kPa), methanol (vapor pressure at 20° C.: 13.0 kPa), and tetrahydrofuran (vapor pressure at 20° C.: 18.9 kPa). These may be used alone or in combination of two or more kinds thereof. Above all, the first organic solvent preferably exhibits compatibility with a second organic solvent which will be described below. The first organic solvent may be cyclohexanone or ethanol.

(Second Organic Solvent (B2))

The second organic solvent is not particularly limited as long as it has a vapor pressure at 20° C. of 0.5 Pa or more and less than 200 Pa, and a known organic solvent can be used. The vapor pressure at 20° C. of the second organic solvent may be 0.6 Pa or more, 0.7 Pa or more, 0.8 Pa or more, 0.9 Pa or more, or 1 Pa or more. The vapor pressure at 20° C. of the second organic solvent may be 190 Pa or less, 180 Pa or less, 150 Pa or less, 100 Pa or less, 50 Pa or less, or 30 Pa or less.

Examples of the second organic solvent include glycerin (vapor pressure at 20° C.: 1 Pa), terpineol (vapor pressure at 20° C.: 13 Pa), and ethylene glycol monomethyl ether (vapor pressure at 20° C.: 130 Pa). These may be used alone or in combination of two or more kinds thereof. Above all, the second organic solvent preferably exhibits compatibility with the above-described first organic solvent. The second organic solvent may be glycerin or terpineol.

The content of the organic solvents may be 80 to 20 parts by mass with respect to 100 parts by mass of the total mass of the composition. The content of the organic solvents may be 75 parts by mass or less, 70 parts by mass or less, or 65 parts by mass or less. The content of the organic solvents may be 30 parts by mass or more, 40 parts by mass or more, or 50 parts by mass or more.

The ratio (mass ratio) of the content of the first organic solvent (B1) to the content of the second organic solvent (B2) (the content of the first organic solvent (B1)/the content of the second organic solvent (B2)) in the composition may be 0.25 to 4.0, 0.5 to 3.5, or 1.0 to 3.0. If the ratio of the content of the first organic solvent (B1) to the content of the second organic solvent (B2) is within such a range, the composition is easily atomized, and thus, a wiring having a more sufficient thickness can be formed.

<Other Components>

The composition may contain components other than the copper particles and the organic solvents as other components, as necessary. Examples of such components include a silane coupling agent, a polymer compound (resin), a radical initiator, and a reducing agent.

The viscosity at 25° C. of the composition is not particularly limited but can be appropriately set according to the method of using the composition. For example, in the case of applying the composition to aerosol jet printing, the viscosity may be 50 to 3000 mPa·s, 100 to 1500 mPa·s, or 200 to 1500 mPa·s. The viscosity at 25° C. of the composition means a viscosity at 25° C., as measured using an E-type viscometer (manufactured by Toki Sangyo Co., Ltd., trade name: VISCOMETER-TV22, applicable cone plate type rotor: 3°×R17.65).

A method for producing the composition is not particularly limited and a method usually used in the technical field can be used. For example, the composition can be prepared by subjecting copper particles and organic solvents, and other components as necessary to a dispersion treatment. For the dispersion treatment, a media disperser such as an Ishikawa type stirrer, an autorotation and revolution type stirrer, an ultrathin-film high-speed rotation type disperser, a roll mill, an ultrasonic disperser, a bead mill, and the like; a cavitation stirring device such as a homomixer, a Silverson stirrer, and the like; a counter-collision method such as ULTIMIZER and the like; and others can be used. Further, these methods may be used in appropriate combination.

By using the composition of the present embodiment, it is possible to form a wiring having a sufficient thickness even in the case of being applied to aerosol jet printing. Incidentally, it may be possible to form a wiring even on a base material having a curved surface, an uneven surface, or the like by applying the composition according to the present embodiment to aerosol jet printing.

[Method for Producing Conductor]

The method for producing a conductor according to the present embodiment includes a step of atomizing the composition according to the above-described embodiment (atomizing step) and a step of printing the atomized composition (printing step).

The atomizing step and the printing step can be performed using, for example, a spraying device including an atomizer and a discharge nozzle connected to the atomizer. As such a spraying device, a device to which a known jetting method is applied can be used as it is. Examples of the known jetting method include an aerosol jet method such as an aerosol deposition method, a cold spray method, a thermal spray method, and the like; and other methods. The conditions of the atomizing step and the printing step can be appropriately set in consideration of the type and content of the copper particles, the type and content of the organic solvents, and the like.

The method for producing a conductor may further include a step of sintering the printed composition (sintering step). The copper particles contained in the composition may have a structure in which the copper particles are fused to each other after the sintering step.

In the sintering step, for example, the composition may be sintered by heating. The heating temperature in this case may be 300° C. or lower, 250° C. or lower, or 230° C. or lower. The heating method is not particularly limited but may be heating using a hot plate, heating using an infrared heater, or the like. The heating may be performed at a constant temperature or at an irregularly varying temperature. Alternatively, in the sintering step, the composition may be sintered by irradiation with a laser such as a pulsed laser and the like.

An atmosphere in which the sintering step is carried out is not particularly limited but may be an inert gas atmosphere such as nitrogen, argon, and the like used in a typical step for producing a conductor, or may be a reducing gas atmosphere formed by adding a reducing substance such as hydrogen, formic acid, and the like to an inert gas atmosphere. A pressure in the sintering step is not particularly limited but the step may be performed under atmospheric pressure or reduced pressure. A sintering time (heating time or laser irradiation time) in the sintering step is not particularly limited but may be appropriately set in consideration of a heating temperature, the energy of a laser, an atmosphere, a content of the copper particles, and the like.

The method for producing a conductor may include other steps as necessary. Examples of the other steps include a step of removing the organic solvents from the printed composition, a step of roughening a surface of a molded article thus obtained, and a step of washing a surface of a molded article thus obtained.

[Conductor]

The conductor according to the present embodiment includes a sintered body obtained by sintering the composition according to the above-described embodiment. Examples of the shape of the conductor include a thin film shape and a pattern shape. The conductor according to the present embodiment can be used to form a wiring, a film, and the like of various electronic parts. The conductor according to the present embodiment has a sufficient thickness (for example, 1 µm or more) even if it is a thin wire (for example, a line width of 200 µm or less), and therefore, it can be suitably used for MID. Further, the conductor according to the present embodiment is also suitably used for applications such as decoration, printing, and the like which are not intended to conduct electricity. In addition, the conductor according to the present embodiment can also be suitably used as a plating seed layer. In a case where the conductor is used as the plating seed layer, the type of a metal used for a plating layer formed on the plating seed layer is not particularly limited but the plating method may be either electrolytic plating or electroless plating.

A volume resistivity of the conductor may be 75 µΩ·cm or less, 50 µΩ·cm or less, 30 µΩ·cm or less, or 20 µΩ·cm or less.

[Structure]

The structure according to the present embodiment includes a base material and the conductor according to the above-described embodiment provided on the base material. A material of the base material is not particularly limited and may or may not have conductivity. Specifically, examples of the material include metals such as Cu, Au, Pt, Pd, Ag, Zn, Ni, Co, Fe, Al, Sn, and the like, alloys of these metals, semiconductors such as ITO, ZnO, SnO, Si, and the like, glass, ceramic, carbon materials such as black lead, graphite, and the like, resins, paper, and combinations thereof. Since the conductor according to the above-described embodiment can be formed at a low temperature (for example, 300° C. or lower), it becomes possible to form a metal foil, a wiring pattern, or the like even on a resin base material having relatively low heat resistance. Examples of the resin having low heat resistance include polyolefin resins such as a polyethylene resin, a polypropylene resin, a polymethylpentene resin, and the like; and polycarbonate resins. The shape of the base material is not particularly limited but any shape such as a film, a sheet, a plate (a substrate), a shape having a curved surface, and the like can be selected.

The structure according to the present embodiment can be suitably used as an MID. Specifically, the structure is used for electronic parts such as a smartphone antenna, a vehicle-mounted wiring, a laminate, a solar cell panel, a display, a transistor, a semiconductor package, a multilayer ceramic capacitor, and the like; and others. The structure according to the present embodiment can be used as a member such as an electric wiring, a heat radiation film, a surface coating film, and the like.

EXAMPLES

Hereinafter, the present invention will be described in detail with reference to Examples, but the present invention is not limited thereto.

Examples 1 to 12 and Comparative Examples 1 to 36

[Preparation of Composition]

65 parts by mass of copper particles (A) shown below and 35 parts by mass of organic solvents (B) at ratios (mass ratios) shown in Tables 1, 2, and 3 were mixed to prepare each of compositions of Examples 1 to 12 and Comparative Examples 1 to 36. The viscosities at 25° C. of the compositions of Examples 1 to 12 and Comparative Examples 1 to 36 are shown in Tables 1, 2, and 3.

<Copper Particles (A)>

As the copper particles, a mixture of spherical copper particles (A1) and flake-shaped copper particles (A2) at 70:30 (mass ratio) (a content ratio of the content of the spherical copper particles (A1) to the content of the flake-shaped copper particles (A2): 2.3) was used.

Spherical copper particles (A1): Trade name: CH0200, Mitsui Mining & Smelting Co., Ltd., median diameter (D50): 0.15 μm Flake-shaped copper particles (A2): Trade name: 1050YF, Mitsui Mining & Smelting Co., Ltd., median diameter (D50): 1.4 μm Moreover, the median diameter (D50) of the spherical copper particles (A1) and the flake-shaped copper particles (A2) was measured using a submicron particle analyzer N5 PLUS (manufactured by Beckman Coulter, Inc.).

<Organic Solvents (B)>

First Organic Solvent (B1)
  Cyclohexanone (B1-1) (vapor pressure at 20° C.: 260 Pa)
  Ethanol (B1-2) (vapor pressure at 20° C.: 5.95 kPa)

Second Organic Solvent (B2)
  Glycerin (B2-1) (vapor pressure at 20° C.: 1 Pa)
  Terpineol (B2-2) (vapor pressure at 20° C.: 13 Pa)

Other Organic Solvents (B3) (Organic Solvents Having a Vapor Pressure at 20° C. of More than 20 kPa)
  Acetone (B3-1) (vapor pressure at 20° C.: 24.7 kPa)
  Diethyl ether (B3-2) (vapor pressure at 20° C.: 58.6 kPa)

TABLE 1

| Item | First organic solvent (B1) | Second organic solvent (B2) | (B1):(B2) | (B1)/(B2) | Viscosity (mPa · s) |
|---|---|---|---|---|---|
| Example 1 | Cyclohexanone (B1-1) | Terpineol (B2-2) | 75:25 | 3 | 300 |
| Example 2 |  |  | 50:50 | 1 | 500 |
| Example 3 |  |  | 25:75 | 0.33 | 800 |
| Example 4 | Ethanol (B1-2) |  | 75:25 | 3 | 300 |
| Example 5 |  |  | 50:50 | 1 | 500 |
| Example 6 |  |  | 25:75 | 0.33 | 800 |
| Example 7 | Cyclohexanone (B1-1) | Glycerin (B2-1) | 75:25 | 3 | 500 |
| Example 8 |  |  | 50:50 | 1 | 800 |
| Example 9 |  |  | 25:75 | 0.33 | 1300 |
| Example 10 | Ethanol (B1-2) |  | 75:25 | 3 | 500 |
| Example 11 |  |  | 50:50 | 1 | 800 |
| Example 12 |  |  | 25:75 | 0.33 | 1300 |

TABLE 2

| Item | First organic solvent (B1) | Second organic solvent (B2) | Other organic solvents (B3) | (B1):(B2):(B3) | Viscosity (mPa · s) |
|---|---|---|---|---|---|
| Comp. Exam. 1 | — | — | Acetone (B3-1) | 0:0:100 | 200 |
| Comp. Exam. 2 | Cyclohexanone (B1-1) | — |  | 25:0:75 | 200 |
| Comp. Exam. 3 |  |  |  | 50:0:50 | 200 |
| Comp. Exam. 4 |  |  |  | 75:0:25 | 200 |
| Comp. Exam. 5 | Ethanol (B1-2) | — |  | 25:0:75 | 200 |
| Comp. Exam. 6 |  |  |  | 50:0:50 | 200 |
| Comp. Exam. 7 |  |  |  | 75:0:25 | 200 |
| Comp. Exam. 8 | — | Terpineol (B2-2) |  | 0:25:75 | 200 |
| Comp. Exam. 9 |  |  |  | 0:50:50 | 300 |
| Comp. Exam. 10 |  |  |  | 0:75:25 | 400 |
| Comp. Exam. 11 | — | Glycerin (B2-1) |  | 0:25:75 | 300 |
| Comp. Exam. 12 |  |  |  | 0:50:50 | 400 |
| Comp. Exam. 13 |  |  |  | 0:75:25 | 600 |
| Comp. Exam. 14 | — | — | Diethyl ether (B3-2) | 0:0:100 | 100 |
| Comp. Exam. 15 | Cyclohexanone (B1-1) | — |  | 25:0:75 | 150 |
| Comp. Exam. 16 |  |  |  | 50:0:50 | 150 |
| Comp. Exam. 17 |  |  |  | 75:0:25 | 150 |
| Comp. Exam. 18 | Ethanol (B1-2) | — |  | 25:0:75 | 100 |
| Comp. Exam. 19 |  |  |  | 50:0:50 | 150 |
| Comp. Exam. 20 |  |  |  | 75:0:25 | 150 |
| Comp. Exam. 21 | — | Terpineol (B2-2) |  | 0:25:75 | 150 |
| Comp. Exam. 22 |  |  |  | 0:50:50 | 200 |
| Comp. Exam. 23 |  |  |  | 0:75:25 | 250 |
| Comp. Exam. 24 | — | Glycerin (B2-1) |  | 0:25:75 | 150 |
| Comp. Exam. 25 |  |  |  | 0:50:50 | 200 |
| Comp. Exam. 26 |  |  |  | 0:75:25 | 250 |

TABLE 3

| Item | First organic solvent (B1) | Second organic solvent (B2) | (B1):(B2) | Viscosity (mPa·s) |
|---|---|---|---|---|
| Comp. Exam. 27 | Cyclohexanone (B1-1) | — | 100:0 | 200 |
| Comp. Exam. 28 | Ethanol (B1-2) | — | 100:0 | 200 |
| Comp. Exam. 29 | — | Terpineol (B2-2) | 0:100 | 1000 |
| Comp. Exam. 30 | — | Glycerin (B2-1) | 0:100 | 2000 |
| Comp. Exam. 31 | Cyclohexanone (B1-1) Ethanol (B1-2) | — | 100:0 (B1-1):(B1-2) = 75:25 | 250 |
| Comp. Exam. 32 | | | 100:0 (B1-1):(B1-2) = 50:50 | 250 |
| Comp. Exam. 33 | | | 100:0 (B1-1):(B1-2) = 25:75 | 250 |
| Comp. Exam. 34 | — | Glycerin (B2-1) Terpineol (B2-2) | 0:100 (B1-1):(B1-2) = 25:75 | 1200 |
| Comp. Exam. 35 | | | 0:100 (B1-1):(B1-2) = 50:50 | 1500 |
| Comp. Exam. 36 | | | 0:100 (B1-1):(B1-2) = 75:25 | 1800 |

[Manufacture of Structure]

The obtained compositions of Examples 1 to 12 and Comparative Examples 1 to 36 were each printed on a liquid crystal polymer (LCP) substrate (manufactured by Mitsubishi Engineering-Plastics Corporation) or a polycarbonate (PC) substrate (manufactured by Mitsubishi Engineering-Plastics Corporation) using an aerosol jet printing machine (manufactured by OPTOMEC Inc.) to form a wiring pattern. Thereafter, the printed composition was heated at 225° C. for 60 minutes in a reducing atmosphere or irradiated with a laser while blowing a forming gas (gas with 5% hydrogen and 95% nitrogen) to sinter the copper particles, thereby obtaining a structure including a wiring pattern (conductor).

<Atomization Printability>

A case where the composition could be printed from the nozzle of the aerosol jet printing machine was evaluated as "A" and a case where the composition could not be printed was evaluated as "B". The results are shown in Tables 4, 5, and 6.

<Wiring Formability>

In a case where the composition could be printed from the nozzle of the aerosol jet printing machine, when a resistance value was measured at two points 3 cm away from each other using a digital multimeter resistance tester (CD800a manufactured by Sanwa Electric Instrument Co., Ltd.) for the wiring manufactured on an uneven surface having a height of 5 mm on the substrate, a case where the resistance value was less than 50Ω was evaluated as "A", a case where the resistance value was 50 to 100Ω was evaluated as "B", and a case where the resistance value was more than 100Ω was evaluated as "C". The results are shown in Tables 4, 5, and 6.

<Thick-Film Formability>

In a case where the composition could be printed from the nozzle of the aerosol jet printing machine, the thickness of the wiring on the substrate was measured by a non-contact surface-layer cross-sectional shape measuring system (VertScan, manufactured by Ryoka Systems Inc.). A case where the thickness of the wiring was more than 3.0 μm was evaluated as "A", a case where the thickness was 1.0 to 3.0 μm was evaluated as "B", and a case where the thickness was less than 1.0 μm was evaluated as "C". The results are shown in Tables 4, 5, and 6.

TABLE 4

| Item | Atomization printability | Wiring formability | Thick-film formability | Sintering step | Substrate |
|---|---|---|---|---|---|
| Example 1-1 | A | A | A | Heating in reducing atmosphere | LCP substrate |
| Example 2-1 | A | A | B | | |
| Example 3-1 | A | B | B | | |
| Example 4-1 | A | A | A | | |
| Example 5-1 | A | A | B | | |
| Example 6-1 | A | B | B | | |
| Example 7-1 | A | A | A | | |
| Example 8-1 | A | A | B | | |
| Example 9-1 | A | B | B | | |
| Example 10-1 | A | A | A | | |
| Example 11-1 | A | A | B | | |
| Example 12-1 | A | B | B | | |
| Example 1-2 | A | A | A | Irradiation with laser | PC substrate |
| Example 2-2 | A | A | B | | |
| Example 3-2 | A | B | B | | |
| Example 4-2 | A | A | A | | |
| Example 5-2 | A | A | B | | |
| Example 6-2 | A | B | B | | |
| Example 7-2 | A | A | A | | |
| Example 8-2 | A | A | B | | |
| Example 9-2 | A | B | B | | |
| Example 10-2 | A | A | A | | |

TABLE 4-continued

| Item | Atomization printability | Wiring formability | Thick-film formability | Sintering step | Substrate |
|---|---|---|---|---|---|
| Example 11-2 | A | A | B | | |
| Example 12-2 | A | B | B | | |

TABLE 5

| Item | Atomization printability | Wiring formability | Thick-film formability | Sintering step | Substrate |
|---|---|---|---|---|---|
| Comp. Exam. 1 | B | — | — | Heating in reducing atmosphere | LCP substrate |
| Comp. Exam. 2 | B | — | — | | |
| Comp. Exam. 3 | B | — | — | | |
| Comp. Exam. 4 | B | — | — | | |
| Comp. Exam. 5 | B | — | — | | |
| Comp. Exam. 6 | B | — | — | | |
| Comp. Exam. 7 | B | — | — | | |
| Comp. Exam. 8 | B | — | — | | |
| Comp. Exam. 9 | A | C | C | | |
| Comp. Exam. 10 | A | B | C | | |
| Comp. Exam. 11 | B | — | — | | |
| Comp. Exam. 12 | A | B | C | | |
| Comp. Exam. 13 | A | B | C | | |
| Comp. Exam. 14 | B | — | — | Heating in reducing atmosphere | LCP substrate |
| Comp. Exam. 15 | B | — | — | | |
| Comp. Exam. 16 | B | — | — | | |
| Comp. Exam. 17 | B | — | — | | |
| Comp. Exam. 18 | B | — | — | | |
| Comp. Exam. 19 | B | — | — | | |
| Comp. Exam. 20 | B | — | — | | |
| Comp. Exam. 21 | B | — | — | | |
| Comp. Exam. 22 | A | C | C | | |
| Comp. Exam. 23 | A | B | C | | |
| Comp. Exam. 24 | B | — | — | | |
| Comp. Exam. 25 | A | C | C | | |
| Comp. Exam. 26 | A | B | C | | |

TABLE 6

| Item | Atomization printability | Wiring formability | Thick-film formability | Sintering step | Substrate |
|---|---|---|---|---|---|
| Comp. Exam. 27 | A | C | C | Heating in reducing atmosphere | LCP substrate |
| Comp. Exam. 28 | A | C | C | | |
| Comp. Exam. 29 | A | C | C | | |
| Comp. Exam. 30 | A | C | C | | |
| Comp. Exam. 31 | A | C | C | | |
| Comp. Exam. 32 | A | C | C | | |
| Comp. Exam. 33 | A | C | C | | |
| Comp. Exam. 34 | A | C | C | | |
| Comp. Exam. 35 | A | C | C | | |
| Comp. Exam. 36 | A | C | C | | |

The compositions of Examples 1 to 12 exhibited excellent atomization printability even in the case of being applied to aerosol jet printing and the obtained wirings had a sufficient thickness (thick film) On the other hand, the compositions of Comparative Examples 1 to 36 did not have a sufficient thickness of the wirings even with excellent atomization printability. From these results, it was confirmed that even in a case where the composition of the present invention was applied to aerosol jet printing, it was possible to form a wiring having a sufficient thickness.

The invention claimed is:

1. A composition comprising:
   copper particles; and
   organic solvents,
   wherein a content of the organic solvents is 30 to 70 parts by mass with respect to 100 parts by mass of the total mass of the composition, the organic solvents comprise a first organic solvent having a vapor pressure at 20° C. of 200 Pa or more and 10 kPa or less, and a second organic solvent having a vapor pressure at 20° C. of 0.5 Pa or more and 50 Pa or less, and a mass ratio of the content of the first organic solvent to the content of the second organic solvent in the composition is 0.5 to 3.5.

2. The composition according to claim 1, wherein a content of the copper particles is 30 to 70 parts by mass with respect to 100 parts by mass of the total mass of the composition.

3. The composition according to claim 1, wherein a viscosity at 25° C. of the composition is 50 to 3000 mPa·s.

4. The composition according to claim 1, wherein the composition is configured to be used for aerosol jet printing.

5. A method for producing a conductor, comprising: atomizing the composition according to claim 1; and printing the atomized composition.

6. The method for producing a conductor according to claim 5, further comprising sintering the printed composition.

7. A conductor comprising a sintered body obtained by sintering the composition according to claim 1.

8. A structure comprising:
a base material; and
the conductor according to claim 7 provided on the base material.

9. The composition according to claim 1, wherein the mass ratio of the content of the first organic solvent to the content of the second organic solvent in the composition is 1.0 to 3.0.

10. The composition according to claim 4, wherein a content of the copper particles is 30 to 70 parts by mass with respect to 100 parts by mass of the total mass of the composition.

11. The composition according to claim 4, wherein a viscosity at 25° C. of the composition is 50 to 3000 mPa·s.

12. A conductor comprising a sintered body obtained by sintering the composition according to claim 4.

13. A structure comprising:
a base material; and
the conductor according to claim 12 provided on the base material.

14. The composition according to claim 4, wherein the mass ratio of the content of the first organic solvent to the content of the second organic solvent in the composition is 1.0 to 3.0.

15. The composition according to claim 1, wherein the copper particles comprise copper-containing particles comprising core particles including copper and an organic material covering at least a part of a surface of the core particles.

16. The composition according to claim 1, wherein the copper particles comprise spherical copper particles and flake-shaped copper particles.

17. The composition according to claim 16, wherein a ratio of a content of the spherical copper particles to a content of the flake-shaped copper particles is 0.25 to 4.0.

* * * * *